United States Patent [19]

Burke

[11] Patent Number: 5,042,077
[45] Date of Patent: Aug. 20, 1991

[54] METHOD OF HIGHLIGHTING SUBTLE CONTRAST IN GRAPHICAL IMAGES

[75] Inventor: Thomas M. Burke, Bothell, Wash.

[73] Assignee: General Electric Company, Milwaukee, Wis.

[21] Appl. No.: 326,349

[22] Filed: Mar. 21, 1989

Related U.S. Application Data

[63] Continuation-in-part of Ser. No. 103,772, Oct. 2, 1987, abandoned.

[51] Int. Cl.⁵ .............................................. G06N 9/38
[52] U.S. Cl. ...................... 382/51; 364/413.16; 364/413.22; 382/6
[58] Field of Search ............ 382/51, 6, 18, 54; 340/703, 709; 364/413.13, 413.14, 413.16, 413.19, 413.22

[56] References Cited

U.S. PATENT DOCUMENTS

| | | | |
|---|---|---|---|
| 3,805,239 | 4/1974 | Watanabe | 382/51 |
| 4,189,775 | 2/1980 | Inooye et al. | 382/6 |
| 4,302,672 | 11/1981 | Kato et al. | 364/414 |
| 4,317,179 | 2/1982 | Kato et al. | 364/414 |
| 4,333,145 | 6/1982 | Heusher et al. | 382/42 |
| 4,495,491 | 2/1985 | Postl | 340/709 |
| 4,533,947 | 8/1985 | Smith | 382/6 |
| 4,644,582 | 2/1987 | Morishita et al. | 382/51 |

OTHER PUBLICATIONS

Hans Wiedemann: "Bildverarbeitung auf dem PC" (Image Processing by Personal Computer) "der elektronker" No. 8, 1987, pp. 69 Through 75 and Translation.

Primary Examiner—David K. Moore
Assistant Examiner—Joseph Mancuso
Attorney, Agent, or Firm—Quarles & Brady

[57] ABSTRACT

A display for medical diagnostic equipment produces an image of the subject under study and a histogram image which indicates the distribution of brightness levels of the image pixels. Using a trackball, the operator manipulates a contrast window which is displayed on the histogram and which enables the operator to select brightness ranges in the image for contrast enhancement.

6 Claims, 4 Drawing Sheets

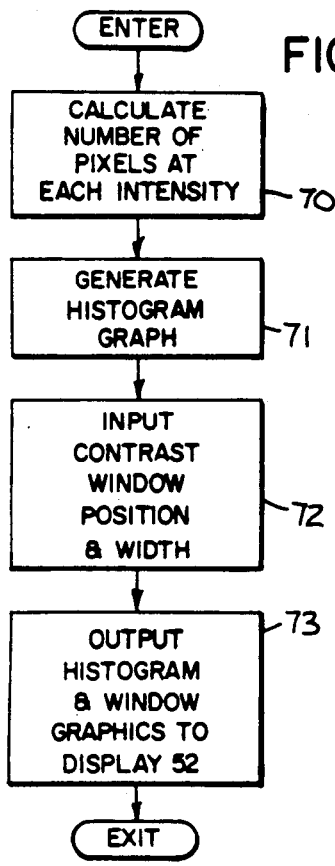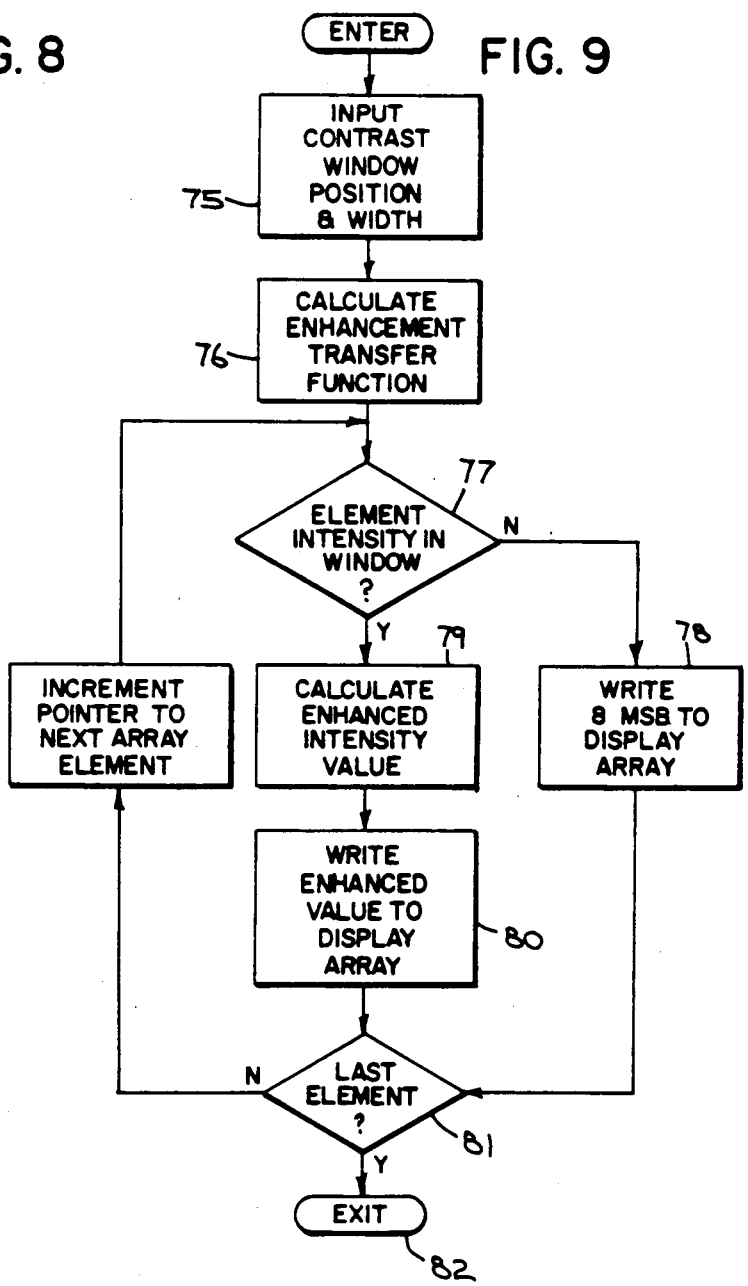

METHOD OF HIGHLIGHTING SUBTLE CONTRAST IN GRAPHICAL IMAGES

CROSS REFERENCE

This application is a continuation-in-part of application Ser. No. 07/103,772, filed Oct. 2, 1987 and now abandoned.

BACKGROUND OF THE INVENTION

The field of the invention is the display of images for human visualization and, particularly, the display of intensity data which has a much higher resolution in contrast levels than is perceivable by humans.

Image display technology is used to transmit visual information to human beings. Common examples are television pictures, photographic film and prints, transparency projection, and computer graphics display monitors. Such images are formed by a series of single, smallest physically resolvable elements, called pixels, in which each pixel has a brightness, or intensity level, which ranges from the blackest-black through mid-grays, to the whitest-white. Especially in the display of medical images, such as ordinary X-ray films, the brightness, or "grey scale", information is as important as the structural, anatomical or morphological information in the image.

In every image display or reception system there will be some lowest level of reliably discernable discrete step in gray-scale value, or contrast resolution. The value of the range from deepest possible "black" to whitest possible "white", divided by the value of smallest discernable step in that intensity is called the image's dynamic range. The dynamic range of image pixel values commonly is expressed logarithmically by using logarithms of base-2.

$$\{\text{LINEAR BRIGHTNESS RANGE}\}/ \quad (2)$$

$$\{\text{SMALLEST BRIGHTNESS STEP}\} =$$

$$[\text{BITS OF DYNAMIC RANGE}]$$

This is technically convenient because it corresponds to the binary counting scheme employed to store data in digital computers. For example, if the dynamic range of an image is 12 bits, then the brightness value for each pixel in the image will require 12 bits of memory for storage.

Image data comes from a primary modality instrument such as a television camera, an X-ray machine, an ultrasound system, or a magnetic resonance imaging (MRI) system. The intensity values in the acquired data array have a one-to-one correspondence with the pixels in the final image to be displayed. The numerical intensity value stored in each location of the data array is employed to control the brightness of its corresponding display pixel.

But the originally acquired data array values usually cannot be directly transferred to the display. They do not match appropriately to the display medium, or the visual needs of the observer. For example, MRI acquired data arrays may have values that are negative algebraically, as well as positive, and one cannot generate negative light intensity for a display. Consequently, a numerical scaling process must be used to offset the baseline level to fit the range of values in the acquired data array onto the range of values which can be displayed physically. Such "static windowing", or "contrast windowing" is a well known procedure.

While the offset image array values may in principle be physically displayable, further processing may be required to meet the needs of human observers. For example, while 12-bit intensity, or brightness, values may be presented on a CRT display, humans are not able to perceive the very small changes in brightness that such data presents. Indeed, humans have a dynamic brightness range under the best of conditions in the range of 6 to 7 bits with the result that the least significant 5 or 6 bits of the 12-bit display brightness information is not perceived. Thus, while the least significant bits of the 12-bit image array data may indicate meaningful variations of 5 or 6 bits in brightness dynamic range throughout a region of the image, the human observer may only perceive a single brightness, or shade. The loss of such information can have an enormous impact in medical applications where such detailed variations in brightness may represent important anatomical or morphological features.

One method for overcoming this problem begins by placing the average of the intensity values at the midpoint of the 6 to 8-bit useful dynamic range of the display. This method is referred to as "static contrast windowing" and it requires prior knowledge of the average value of the region of interest in the image. Such static contrast windowing is routinely performed by radiologists who adjust the X-ray exposure factors and film-screen speed to put the average X-ray transmission through the anatomical region of interest at the central sensitivity region of the film.

Such static contrast windowing is illustrated in FIG. 1 where the horizontal axis represents the entire range of intensity values which the image data may have, and the vertical axis indicates the more limited range of brightnesses on the visual display. The dashed lines 1 and 2 define the full range, or "contrast window" of intensity values which will be mapped to the display. The solid line 3 is a transfer curve which indicates how the intensity values are mapped to the display brightness values. Intensity values which are below the contrast window in value are limited to black and values above the contrast window are "clipped" and displayed white. An intensity value within the contrast window is mapped to a corresponding display brightness value as indicated by the arrows 4. The display value is determined by the shape of the transfer curve 3, which in FIG. 1 is a straight line.

Contrast windowing is "static" when the window and the transfer curve are fixed for the conversion of the entire image data array. Details within the intensity range of the contrast window are shown on the display within a 6 to 8 bit dynamic range. The remaining parts of the image, however, are shown either "too white" or "too black" and details therein are not perceivable. For diagnostic medical image studies, all regions of brightness may require examination for abnormal anatomic details. This requires that multiple images be displayed, each with a different contrast window which insures that anatomical details at all brightness levels will be displayed. Modern digital imaging instruments such as X-ray CT, digital-subtraction angiography, digital cassette radiography and nuclear magnetic resonance imaging work stations have controls for setting the LEVEL, or midpoint, of the brightness window and its WIDTH.

One approach commonly used in X-ray CT practice is to employ a transfer curve that has two contrast windows. Such a dual window approach is illustrated in FIG. 2, where one window 5 is set to encompass the brightness levels around bone and the other window 6 is set to encompass the brightness levels around soft tissue. This works because the anatomy is regular, and one knows a-priori what part is soft tissue and what part is bone. It is not overwhelmingly confusing to have two regions displayed in the same shifted gray-scale in the same display. However, in any anatomic regions that are intermediate in brightness between the windowed soft tissue and bone, the X-ray CT image values become hopelessly muddled.

Another more recent technique for mapping data brightness levels to a display having a limited dynamic range is known in the art as adaptive contrast enhancement, for which the most successful variant is "adaptive histogram equalization" (AHE). Unlike prior techniques which are "static", the AHE technique does not employ a fixed contrast window for the entire image. Instead, the AHE technique looks at each datum intensity value in the acquired data array one at a time and compares it with the values in a local surrounding spatial area, or "context region". The length and width of the context region may, for example, range from one sixth to one sixtieth of the length and width of the entire image data array. While there are many variations on the precise calculations employed with this technique, the general idea is to map the centered datum value to a display brightness which provides good contrast with respect to the other data values generally within the same context region. The calculations are performed, in principle, at each pixel location in the image data array with respect to its surrounding context region and the technique is, therefore, computationally intense. The AHE technique and some of its variations are described in "The Effectiveness of Adaptive Contrast Enhancement (in Medical Images)", Zimmerman, J. B, Ph.D. Thesis, 1985, UNC, Chapel Hill, University of Microfilms International, Ann Arbor, Mich.; "Spatially Variant Contrast Enhancement Using Local Range Modification", Fahnestock, J. D. and Schowengerdt, R. A., *Optical Engineering*, Vol. 22(3):378–381 (1983); and "Algorithms For Adaptive Histogram Equalization", Pizer, S. M., Austin, J. D. et al., SPIE Vol. 671, *Physics and Engineering of Computer Multidimensional Imaging and Processing* (1986).

SUMMARY OF THE INVENTION

The present invention relates to a system for mapping an acquired array of image intensity data into a displayable image array in which the operator can control the contrast windowing to enhance the contrast over a selected range of intensity values. More specifically, the invention includes means for mapping the entire range of acquired image intensity values to the image array for display, means for producing from the acquired image intensity data a histogram which is displayed to the operator and which indicates the number of image intensity data array elements that have values at each possible intensity value, input means for receiving from the operator a selected range of intensity values over which enhanced contrast is desired, and means for altering the values mapped to elements of the displayable image array that correspond to elements in the image intensity data array that have values which lie within the selected range, such that there is sharper contrast between altered elements.

A general object of the invention is to improve the visibility of low contrast features in medical diagnostic images.

A more specific object of the invention is to provide an interactive system which enables the operator to select a static contrast window. By displaying the histogram to the operator along with the image that is to be enhanced, the operator can more intelligently select a range of intensity values over which contrast windowing is to be performed. For example, the histogram may clearly reveal as a peak the intensity range of bone in the displayed image. The contrast details of bone can then be enhanced by selecting a corresponding range of intensities for contrast enhancement. The enhanced image will provide sharper contrast in the bone structures and will reveal very small variations in intensity values.

Another object of the invention is to facilitate the selection of a contrast window. The location and width of the contrast window is displayed on a screen with the histogram. The operator may control both position and width with manually operable controls and immediately observe the effect on the contrast window.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 8 is a flow chart of the program which is executed to produce the histogram; and FIG. 9 is a flow chart of the program which is executed to produce the enhanced image.

DESCRIPTION OF THE PREFERRED EMBODIMENT

Figure 1:
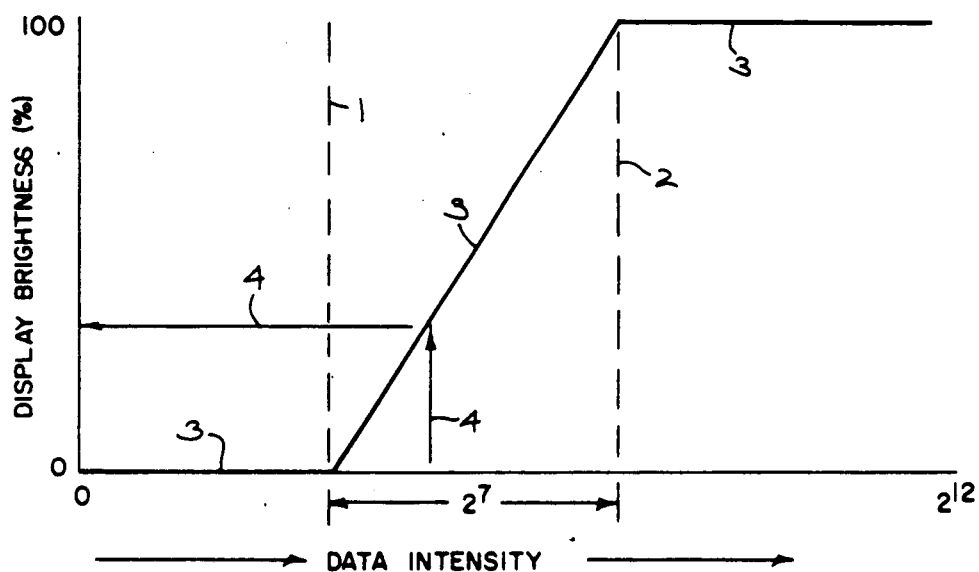
FIG. 1 is a graphic representation of a static contrast window used to map brightness values to a display.
Figure 2:
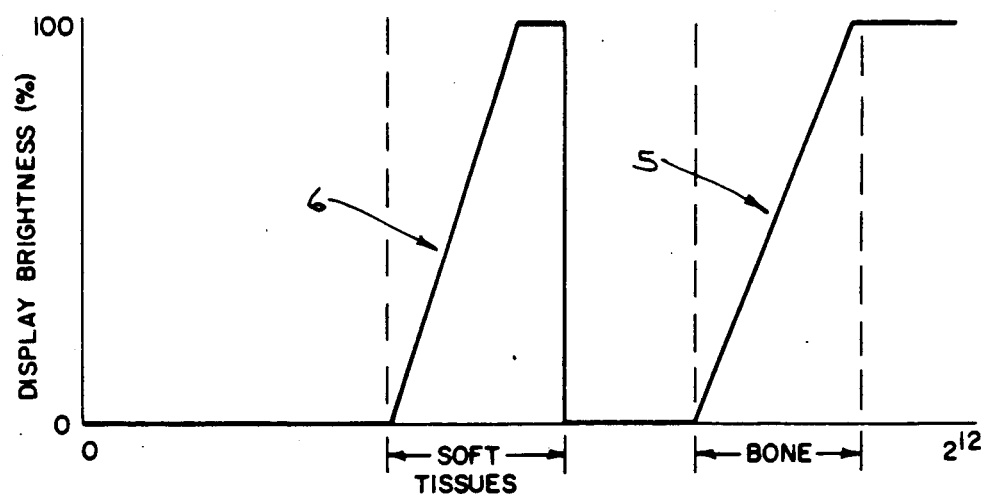
FIG. 2 is a graphic representation illustrating the use of two static contrast windows.
Figure 3:
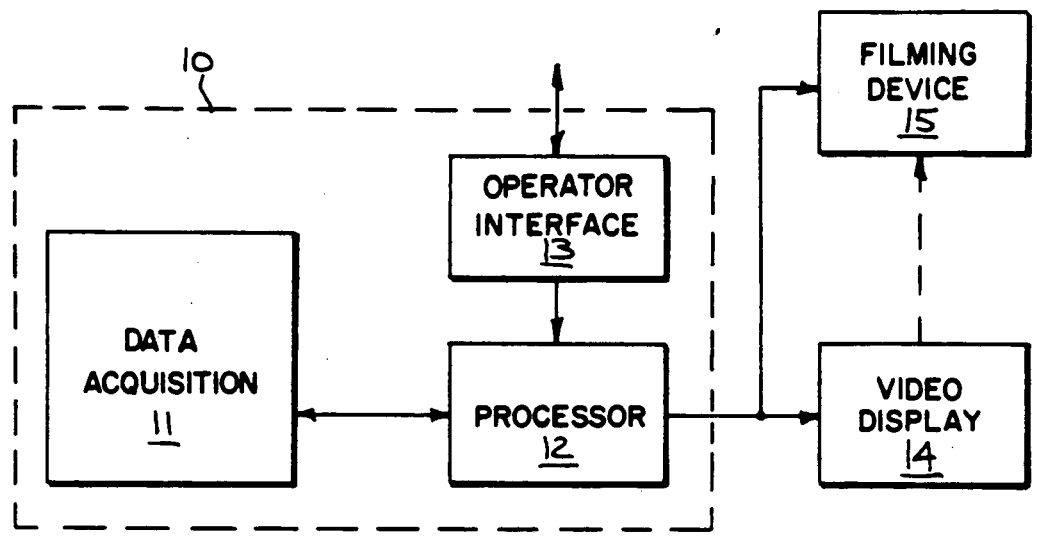
FIG. 3 is a block diagram of a system suitable for practicing the present invention.

Referring to FIG. 3, a system 10 includes data acquisition apparatus 11 and a processor 12. An operator interface 13 is coupled to processor 12 to allow an operator to control the operation of system 10 (such as the level and width of the contrast window). Coupled to the output of processor 12 are a video display 14 and a filming device 15. In medical diagnostic applications, data acquisition apparatus 11 may be any one of a number of well known systems, such as an ultrasound system, NMR apparatus or CT scanner. These systems provide information about an object which can be processed to form an image. Video display 14 is preferably comprised of a cathode ray tube (CRT) and associated electronics to display an image corresponding to an output signal from processor 12. Filming device 15 is constructed to record images projected by video display 14, or alternatively, can be constructed to produce hard copy images.

Figure 4:
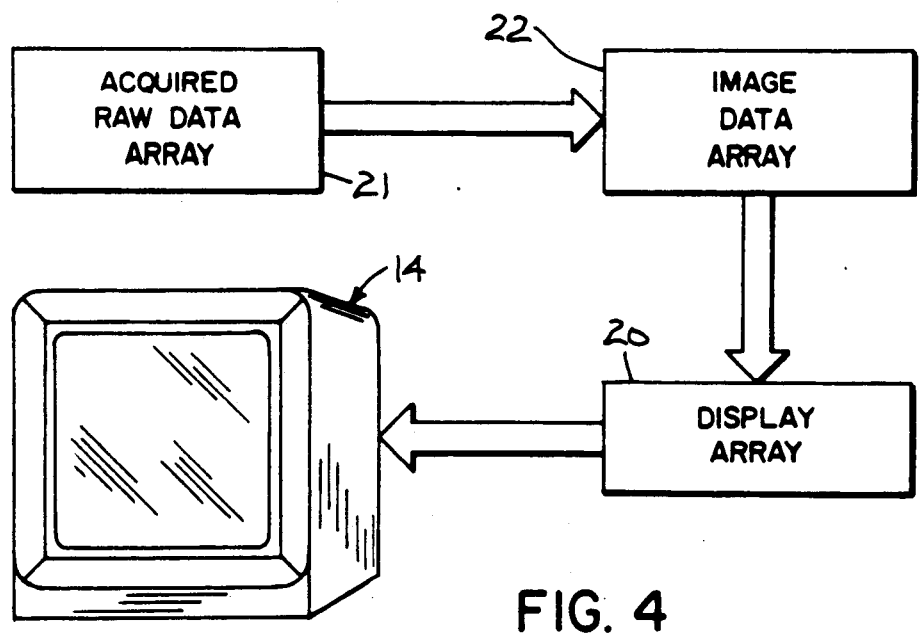
FIG. 4 is a diagram of the data structures used to produce an image according to the present invention.

The images displayed by video display 14 and filming device 15 are produced from an array of data in which each array element indicates the intensity, or brightness of one pixel in the display. As indicated in FIG. 4, a display array 20 may include 256 by 256 elements in which each element is an 8-bit binary number that indicates pixel brightness. The brightness of each pixel on the display screen 14 is continuously refreshed by reading the value of its corresponding element from the display array 20 in the well known manner. For example, in ultrasonography, each pixel has an intensity value in direct proportion to the backscatter cross section of a respective tissue volume in response to ultrasonic interrogating pulses. In NMR imaging, each intensity value represents nuclei spin density in a particular volume which may be weighted according to a particular relaxation property of the nuclei. In X-ray CT, each intensity value represents the X-ray attenuation at a particular location in the subject being imaged.

Although the display 14 produces an image in which each pixel can have one of 256 brightness values ranging from "0" (blackest-black) to "255" (whitest-white), the data acquired by the data acquisition apparatus 11 may have a much higher dynamic range. For example, an NMR system may acquire spin density data which is expressed as a 12-bit binary number, an ultrasound system may acquire backscatter data expressed as a 12-bit binary number and an X-ray CT system may acquire attenuation data expressed as a 10-bit binary number. Regardless of the acquisition technology employed, a two-dimensional array of this high resolution intensity data is produced and must be mapped to the two-dimensional display array 20.

Referring again to FIG. 4, the acquired high resolution data is stored in an acquired raw data array 21 which forms part of the memory in the processor 12. This data is further processed by methods peculiar to each system and acquisition method to produce an image data array 22. For example, the acquired data 21 may be in the form of real and imaginary arrays and may have negative values. In such case, the processing calculates absolute values and then offsets those values to make them all positive. The image data array 22 is also stored in the processor's memory and it has the same dimensions as the display array 20 (for example, 256 by 256), but each element represents an intensity level as a 16-bit binary number. The eight most significant bits of each element of the image data array 22 can be mapped directly to its corresponding 8-bit element in the display array 20 and an image of the object under study will be produced on the video display 14. It is readily apparent, however, that much more intensity information is contained in the least significant bits of each element of the image data array 22, and that this information is not visible when the straight forward mapping of the most significant bits is performed. It is the purpose of the present invention to provide a means for the operator to selectively access this additional information and display it in a form which is perceivable by the human eye and understandable to a radiologist.

Figure 5:
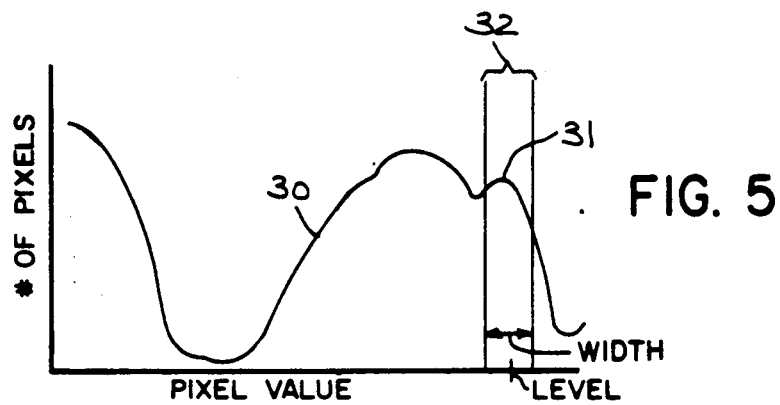
FIG. 5 is an example of a histogram of an image data array.

The present invention provides a feedback mechanism allowing the viewer to survey the 8-bit image produced on the display 14 and select portions of the image for more detailed contrast. The preferred embodiment employs an image pixel histogram 30, an example of which is shown in FIG. 5. The histogram 30 graphically represents the total number of pixels in the image data array 22 having each possible intensity value (referred to as bins). Thus, for each possible intensity value (i.e. 0 through $2^{16}$), there are a number of array elements, or pixels, with that intensity. The pixel histogram 30 is plotted as a graph on the display with the vertical coordinate indicating the number of pixels having a given intensity and the horizontal coordinate indicating each possible intensity value. The use of an image pixel histogram facilitates identification of low contrast tissue populations according to histogram features such as bulge 31. The operator adjusts the level and width of a window 32 using controls which connect to the operator interface 13. The window 32 can be placed around a special feature such as bulge 31 or the operator may alternatively sweep the histogram 30 by sliding the window 32 across the histogram 30 while watching the displayed image for enhanced tissue features. The histogram window 32 is preferably displayed along with the histogram 30, and both its position and width are controlled by the operator.

Using the example of an ultrasound backscatter system for imaging the heart, distinct features in the histogram 30 can appear because (1) a lesion in the image might be characterized by a local pocket of uniform backscatter values that differ from surrounding tissues, and (2) both ischemic and infarcted myocardium give a stronger backscatter signal than normal myocardium. The present invention further contemplates that the operator can specify a region of interest in the main image and then the histogram 30 is constructed for only that region so that only local features are seen.

In real time imaging, the display of the histogram 30 is particularly advantageous in helping to identify certain time dependent tissue characteristics. For example, the expected variation in backscatter signal in ultrasonic examination of a normal heart may not be present when examining diseased heart tissue. By placing the histogram window 32 over an unexpectedly static area of the histogram 30, the resulting enhancement to the image on display 14 may highlight such diseased tissue.

Figure 6:
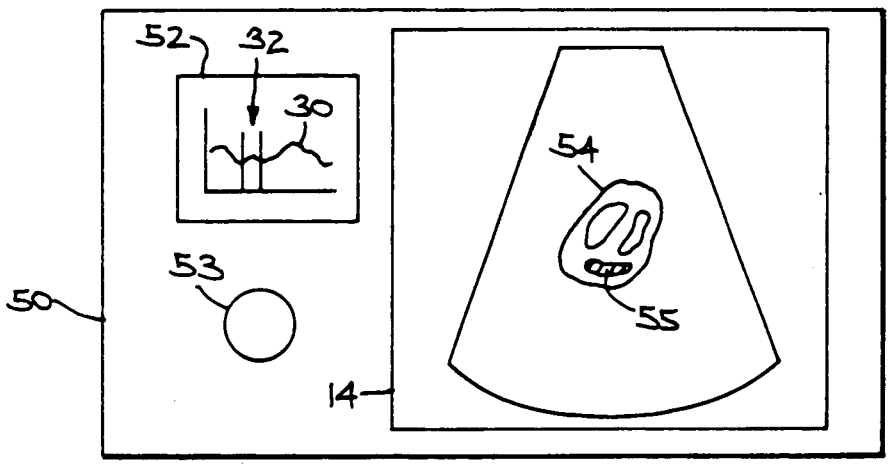
FIG. 6 represents a display apparatus having an ultrasonic sector scan image of a heart and employing the present invention to enhance visualization of a lesion.

Referring to FIG. 6, an interactive display apparatus 50 which connects to the operator interface 13 includes the video display 14, a histogram and window display 52 and a window input device 53. By way of example, video display 14 shows an ultrasound sector scan image of a heart 54. The operator can interactively highlight portions of the image by evaluating the histogram 30 on display 52 and manipulating the input device 53. The input device 53 is a trackball which may be revolved left or right to move the window 32 left or right, or which may be revolved up or down to widen or narrow the window 32. By setting the histogram window 32 to a particular portion of the histogram, a lesion 55 in heart 54 is highlighted by a high contrast overlay of the lower contrast image on the display 14.

There are a number of ways in which the intensity values within the range of the contrast window 32 can be enhanced. One approach is to use the color capability of the display 14 to overlay the gray scale image with a color image. Only those pixels having an intensity within the contrast window are displayed with color, and different colors can be used to represent different segments of the 16-bit dynamic range.

Figure 7:
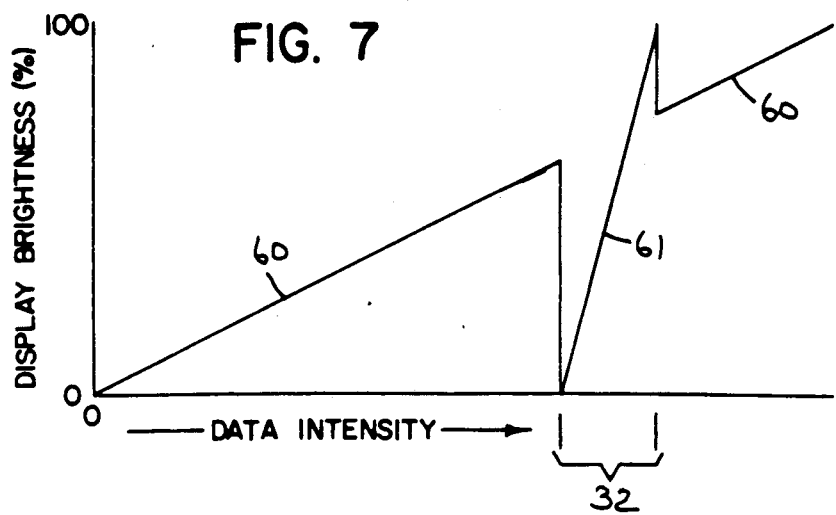
FIG. 7 is a graphic representation of the transfer function employed in the preferred embodiment of the invention.

Another approach is illustrated in FIG. 7. The unenhanced image on the display 14 is produced by using the eight most significant bits from each element of the image data array 22. This is represented by the gently sloped transfer curve 60 which maps the wide dynamic range of the data onto the narrower dynamic range of the display 14. Superimposed on this transfer curve 60, however, is a high contrast transfer curve 61 which is defined by the operator adjustable contrast window 32. The steep slope of the transfer curve 61 indicates that small changes in data intensity within the contrast window 32 produce larger changes in pixel brightness on the display 14. The slope of the transfer curve 61 is, of course, determined by the width of the contrast window 32.

The generation of the enhanced image according to the teachings of the present invention is accomplished in the preferred embodiment by programming the processor 12 to process the image data array 22. These programs are stored in the processor's memory and they will now be described with respect to the flowcharts in FIGS. 8 and 9.

Referring particularly to FIG. 8, the histogram display is produced using the values in the image data array 22. More specifically, the number of array values at each of a plurality of intensity levels are calculated as indicated at process block 70. Each intensity level, or "bin", represents a point along the horizontal axis of the histogram display and the values in the image data array 22 are examined one at a time to determine in which bin they fall. As indicated by process block 71, after all values have been examined, a graph is produced which indicates the intensity levels or bins along the horizontal axis and the number of array values within each bin along the vertical axis. This process can, in the alternative, be accomplished using dedicated hardware as described in U.S. Pat. No. 4,802,090 entitled "Histogramming of Pixel Values On A Distributed Processing System".

As indicated at process block 72, the settings of the trackball input device 53 are then input and converted to digital values which represent contrast window position and contrast window width. These values are used to produce graphic representations of the selected contrast window, and this, along with the histogram graph, are output to the display 52. The entire histogram program is executed each time the contents of the image data array 22 are changed. Otherwise, process blocks 72 and 73 are periodically executed to update the display 52 with any changes in the contrast window selection.

Referring particularly to FIG. 9, the image produced on the display 14 from the value in the image data array 22 is enhanced in accordance with the contrast window selections. As indicated at process block 75, the current contrast window position and width values are input from the trackball window input device 53, and a transfer function is calculated from these values as indicated as process block 76.

The system then enters a loop in which the value of each element of the image data array 22 is examined and mapped to its corresponding element in the display array 20. If the intensity value of the elements lies outside the range of the selected contract window as determined at decision block 77, the eight most significant bits of the value are written to the display array 20 as indicated at process block 78. In other words, the intensity value is not enhanced. On the other hand, if the intensity value lies within the range of the selected contrast window, an enhanced intensity value is calculated at process block 79 using the previously calculated transfer function. The enchanced intensity value is then written to the display array 20 as indicated at process block 80. The system then loops at decision block 81 and the pointer to the next array element is incremented at process block 82. After all array elements have been processed as determined at decision block 81, the routine is exited at 82. During the next refresh of the display 14, the newly processed intensity data in the display array 20 will be used to produce the desired enhanced image.

I claim:

1. A display system for producing an image from an image data array which comprises:

video display means for displaying an image comprised of an array of pixels in which intensity values are assigned to each of the pixels to determine their brightness in the image;

means coupled to the image data array for producing histogram data which indicates the distribution of intensity values in the image data array;

histogram display means for displaying a histogram image of the histogram data;

window setting means for enabling an operator to select a range of intensity values within the histogram image which are to be enhanced; and means for coupling the intensity values in the image data array to the video display means such that intensity values outside the selected range directly control the brightness of their corresponding pixels in the image, and intensity values within the selected range are altered to enhance the contrast between their corresponding pixel brightnesses.

2. The display as recited in claim 1 in which the means for coupling the intensity data in the image data array to the video display means includes means for applying a transfer function to the intensity values within the selected range and means for selecting the most significant bits of the intensity values outside the selected range.

3. The display as recited in claim 1 in which the window setting means may be adjusted by the operator to select different ranges of intensity values, and as each selection is made, a corresponding enhanced image is produced on the video display means.

4. The display as recited in claim 1 in which the window setting means includes manually operable means for adjusting the position of the window within the histogram image and means for adjusting the width of the window within the histogram image.

5. The display as recited in claim 4 in which the manually operable means includes a trackball.

6. The display as recited in claim 1 in which the histogram display means includes means coupled to the window setting means for displaying on the histogram display means an indication of the range of intensity values which have been selected.

* * * * *